(12) United States Patent
Toncich et al.

(10) Patent No.: US 8,072,297 B2
(45) Date of Patent: Dec. 6, 2011

(54) APPARATUS AND METHOD FOR IMPROVING CHANNEL FILTER SELECTIVITY AND PERFORMANCE USING VOLTAGE VARIABLE IMPEDANCE ELEMENTS

(75) Inventors: Stanley S. Toncich, San Diego, CA (US); Amol Rajkotia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 167 days.

(21) Appl. No.: 12/344,903

(22) Filed: Dec. 29, 2008

(65) Prior Publication Data
US 2010/0164649 A1 Jul. 1, 2010

(51) Int. Cl.
*H03H 7/01* (2006.01)
*H01P 1/20* (2006.01)

(52) U.S. Cl. ......................... 333/174; 333/167; 333/202

(58) Field of Classification Search .................. 333/167, 333/168, 174, 181, 202, 204, 205
See application file for complete search history.

(56) References Cited

U.S. PATENT DOCUMENTS 5,701,100 A * 12/1997 Wu et al. ........................ 327/559
5,752,179 A * 5/1998 Dobrovolny .................. 455/266
7,084,722 B2 8/2006 Goyette
7,423,498 B2 9/2008 Dalconzo et al.
7,668,505 B2 2/2010 Vacanti et al.

FOREIGN PATENT DOCUMENTS
EP 0982858 A2 3/2000
JP 60051312 3/1985

OTHER PUBLICATIONS

International Search Report & Written Opinion—PCT/US2009/069617, International Search Authority—European Patent Office Mar. 4, 2010.
Ruiperez M S., et al., "Fast Electronically Tunable Filter Bank" Military Communications Conference, 2005. Milcom 2005. IEEE Atlantic City, NJ, USA Oct. 17-20, 2005, Piscataway, NJ, USA,IEEE, Piscataway, NJ, USA, Oct. 17, 2005, pp. 1-4, XP010901577 ISBN: 978-0-7803-9393-6 p. 1, left-hand column, line 29—right-hand column, line 21; figure 1 p. 2, left-hand column, line 8—right-hand column, line 28 p. 3, left-hand column, line 8—line 16.

* cited by examiner

*Primary Examiner* — Robert Pascal
*Assistant Examiner* — Kimberly E Glenn
(74) *Attorney, Agent, or Firm* — Jiayu Xu

(57) ABSTRACT

A controllable filter arrangement with a voltage controlled device that subjects a signal to a predetermined impedance as part of the filtering process when the voltage controlled device is in an active state. In an inactive state, the voltage controlled device may subject the signal to an impedance that prevents all frequencies of the signal from passing. This configuration may advantageously increase frequency selectivity and reduce insertion loss, size, cost, and tuning complexity when compared with conventional filter designs.

20 Claims, 3 Drawing Sheets

APPARATUS AND METHOD FOR IMPROVING CHANNEL FILTER SELECTIVITY AND PERFORMANCE USING VOLTAGE VARIABLE IMPEDANCE ELEMENTS

TECHNICAL FIELD

The presently disclosed embodiments relate generally to signal processing, and more specifically to filtering a signal to obtain a desired frequency response.

BACKGROUND

Since the inception of signal transmission, there has been a struggle to reduce the amount of interference in the received signal. Interference can be caused by a number of factors. For example, various environmental factors (e.g., mountains, buildings, other man-made structures, etc.) can contribute to signal interference when they are located within the transmission path between a transmitter and a receiver.

Also, with the proliferation of many different methods and devices to transmit signals, there has been a significant increase in the amount of interference that can occur when signals interfere with each other. This can occur when signals propagate through the same medium (e.g., airspace, cable, wire, etc.) as other signals.

Various methods and techniques have been employed to minimize signal interference. For example, the receiving device may include various types of filters to remove unwanted interference from the received signal. These filters have been known to include various types of band pass filters (e.g., filters to permit signals within a predetermined frequency range to pass but removing all other portions of the signal) alone or in combination.

FIG. 1 shows one example of a switched filter bank, which has been used to remove unwanted interference from a received signal. Switched filter bank 100 includes input 102 to receive a signal to be filtered and output 104 to output the filtered signal. A controller (not shown) controls switches 106, 108, and 110 between an open position and a closed position. In the closed position of the switch, the signal can move through the switch (e.g., switch 106a) and its respective filter (e.g., filter 112). In the open position, the signal may not pass through the switch or its respective filter.

For example, if switches 106a and 106b are closed, the signal can be filtered by filter 112. Likewise, if switches 108a and 108b are closed, the signal can be filtered by filter 114, and if switches 110a and 110b are closed, the signal can be filtered by filter 116. Depending on the desired frequency response, one or more of filters 112, 114, and 116 can be used to filter the signal before it is output via output 104.

However, there are several drawbacks to using the switched filter bank. Specifically, the switches in the switched filter bank increase the insertion loss of the device, which degrades the sensitivity of the device. In addition, the switches in the switched filter bank increase the size and cost of the device.

Turning now to FIG. 2, a multiplexed filter is shown that has also been used to filter received signals. Multiplexed filter 200 includes input 202 and output 204. Filters 206, 208, and 210 are coupled in parallel to input 202 and output 204.

In operation, multiplexed filter 200 utilizes filters 206, 208, and 210 to pass all the desired channels (e.g., frequencies), similar to the switched filter bank, discussed above. However, multiplexed filter 200 uses input and output common node matching networks rather than switches. Although this feature reduces the insertion loss of multiplexed filter 200 when compared to the insertion loss of the switched filter bank, it also provides less selectivity than the switched filter bank since the multiplexed filter passes all frequencies in its combined pass band simultaneously. Thus, there is little interference rejection provided by the multiplexed filter.

Although not shown in the figures, tunable band pass filters have also been used, if they can meet the required performance specifications of a particular application, to filter out unwanted interference in a received signal. However, typical tunable band pass filters have been known to require complex tuning, alignment, and control functions.

There is therefore a need in the art for a device and method that can be used to filter out unwanted interference from a signal in a manner that provides lower insertion loss than the switched filter bank, better frequency selectivity than the multiplexed filter, and with less complex tuning, alignment, and control than the tunable filter.

SUMMARY

Embodiments disclosed herein address the above stated needs by providing a filter with a voltage variable impedance element that acts as a switch and as an impedance-contributing element (e.g., part of the filtering process) when the filter element with which the voltage variable impedance element is associated is used to filter the signal.

In one aspect, a plurality of the voltage variable impedance elements may be selectively placed in an active state, inactive state, or various combinations thereof to obtain a desired frequency response from the filter.

DETAILED DESCRIPTION

Figure 1:
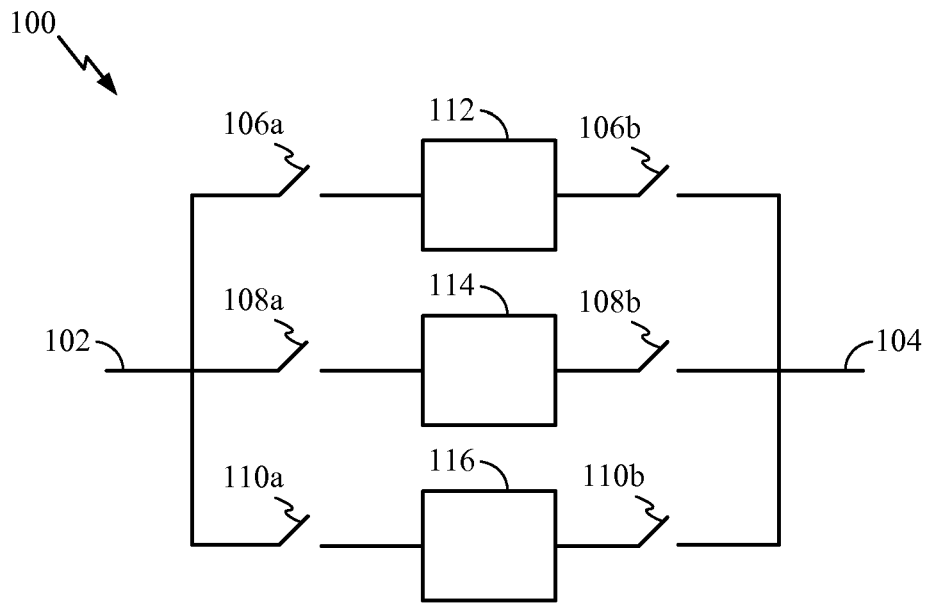
FIG. 1 is a known switched filter bank.
Figure 2:
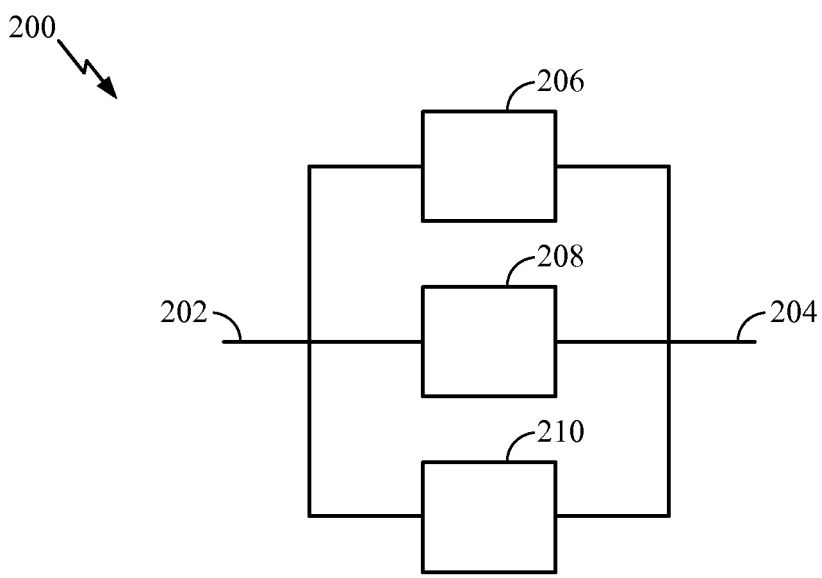
FIG. 2 is a known multiplexed filter.

The word "exemplary" is used herein to mean "serving as an example, instance, or illustration." Any embodiment described herein as "exemplary" is not necessarily to be construed as preferred or advantageous over other embodiments. In addition, references to "an," "one," "other," or "various" embodiments should not be construed as limiting since various aspects of the disclosed embodiments may be used interchangeably within other embodiments.

The filter devices and methods described below can be used in any device, apparatus, or system that could benefit from signal filtering, including, for example, channelized receivers, mobile/cellular telephones, multi-band radios and/or transceivers (e.g., wired or wireless). As used herein, the term "filter" may be used to describe a device through which a signal may be passed in order to remove unwanted components of the signal, which may include, for example, certain frequencies, artifacts, and interference. The term "filter element" is used herein to describe a component of a filter that is capable of actively participating in the filtering process (e.g., removing unwanted signal components) and exhibit varying impedance over frequency.

When selected filter elements are connected in a particular arrangement, the arrangement forms a filter that has a particular filter response dependent on the selected filter elements. The response of the filter formed by the arrangement of filter elements may have a band pass filter response where signals within a desired frequency band are attenuated less than frequencies outside the desired frequency band. Also, the filter may have a stop-band filter response where signals within a stop band are attenuated more than frequencies outside the desired frequency band. The filter may have low pass filter response where signals below a selected frequency are attenuated less than frequencies above the frequency. Where signals below a selected frequency are attenuated more than frequencies above the frequency, the filter has a high pass filter response.

Examples of filter elements may include, among others, a capacitive element such as a capacitor, an inductive element such as an inductor, and a resistive element such as a resistor. Some filter elements may be voltage controlled devices that have characteristics that depend on an applied control voltage. In one aspect, a voltage controlled device is a voltage variable impedance element that has an impedance that is varied by the control voltage (e.g., control signal). For example, as discussed below, a voltage controlled device may be a voltage variable capacitor or a voltage variable inductor.

In operation, a voltage controlled device may, in an active state, contribute to the filtering process by subjecting the signal to a predetermined impedance from the voltage controlled device. As used herein, an "active state" of the voltage controlled device refers to a state in which the voltage controlled device is set to participate in the filtering of a signal, either alone or in combination with one or more other filter elements (e.g., band pass filter elements, stop-band filter elements, low pass filter elements, high pass filter elements, other voltage controlled devices). Conversely, a voltage controlled device may be placed in an "inactive state," which is a state in which the voltage controlled device subjects the signal to an impedance that prevents all frequencies of the signal from passing. None of the known techniques discussed in the Background section utilize this type of configuration.

Figure 3:
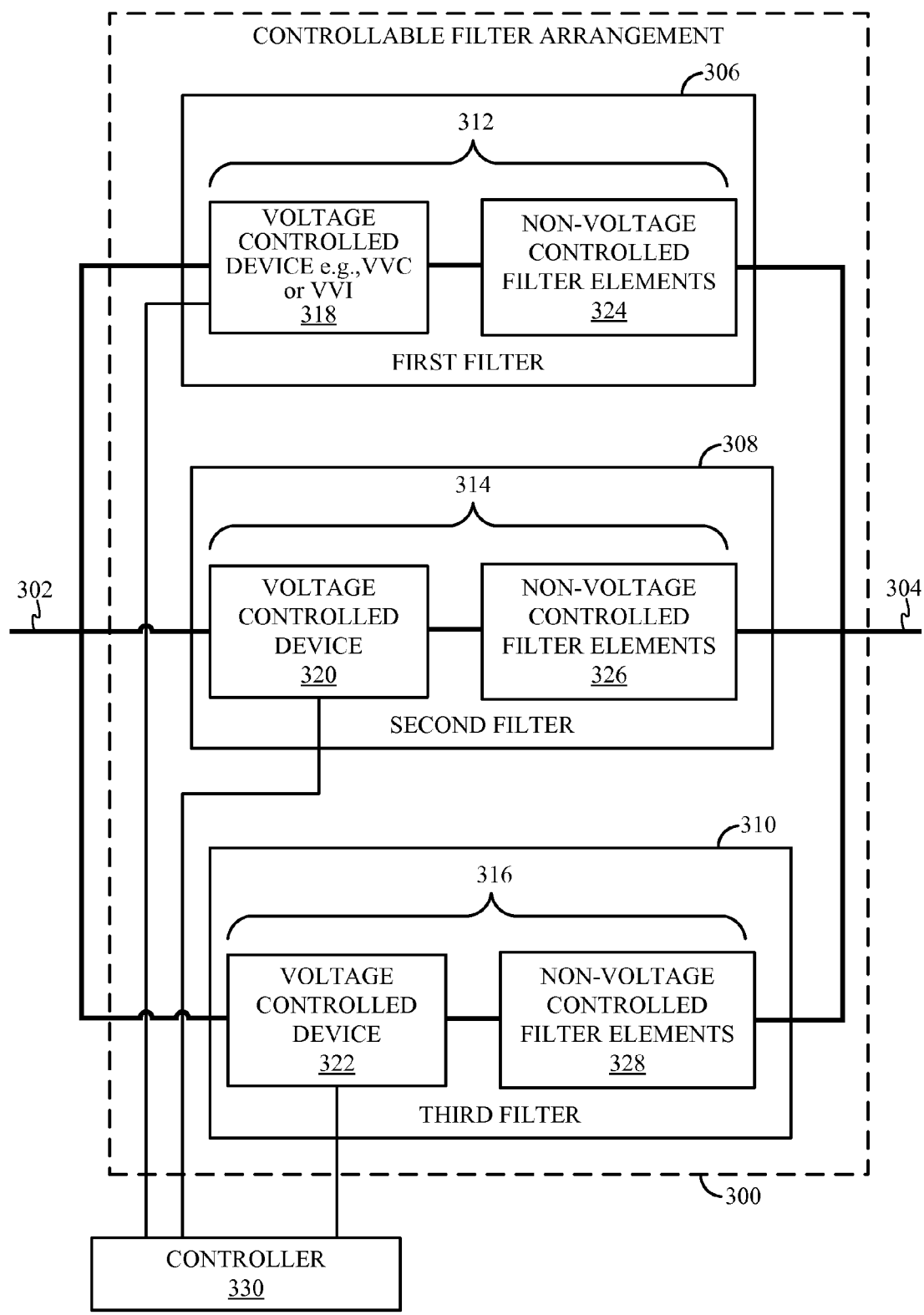
FIG. 3 is a schematic of a controllable filter arrangement with voltage controlled devices.

FIG. 3 is a block diagram of a controllable filter arrangement example. The controllable filter arrangement 300 includes input 302 to receive a signal to be filtered and output 304 to provide the filtered signal. The input 302 is connected to the inputs of three filters 306, 308, 310 that are connected in parallel and have output connected to the output 304. Each filter 306, 308, 310 includes a plurality of filter elements 312, 314, 316.

For this example, the controllable filter arrangement includes three filters where each plurality of filter elements forming a filter includes a voltage controlled device 318, 320, 322. The filter arrangement may include a different number of filters and each filter may include any number of voltage controlled devices. The arrangement, however, includes at least two filters where at least one of the filters includes a voltage controlled device. Each plurality of filter elements forming a filter includes at least one other filter element that is not voltage controlled.

Accordingly, the first filter 306 is formed by a first plurality of filter elements 312 that includes a voltage controlled device 318 and other filter elements 324. The second filter 308 is formed by a second plurality of filter elements 314 that includes a voltage controlled device 320 and other filter elements 326. The third filter 310 is formed by a third plurality of filter elements 316 that includes a voltage controlled device 322 and other filter elements 328.

Each filter, however, is only formed when the voltage controlled device is in an active state. In the active state, the voltage controlled device forms a filter element of the plurality of filter elements. In the inactive state, the voltage controlled device is a relatively high impedance that minimizes any path through the other filter elements of the filter. Although the voltage controlled devices are illustrated as directly connected to the input, the voltage controlled devices may be connected anywhere within the filter. For the examples herein, the voltage controlled devices are series elements of the filter.

For the example, each filter is used to pass a different frequency range. The different frequency ranges of the filters may or may not overlap. As will be seen below, additional filters can provide enhanced frequency selectivity or otherwise change performance. In some circumstances, the benefits of improved frequency selectivity from adding additional filters should be balanced against the increased size and cost of adding the additional filters.

In the example shown in FIG. 3, voltage controlled devices 318, 320, and 322 are each coupled in series with filter elements 324, 326, and 328, respectively. In operation, each of voltage controlled devices 318, 320, and 322 are capable of subjecting a signal to a different impedance. For example, controller 330, which is coupled to each of voltage controlled devices 318, 320, and 322, can send a control signal (e.g., a control voltage) to voltage controlled device 318 to place voltage controlled device 318 in an active state or an inactive state. Similarly, controller 330 can send control signals to voltage controlled devices 320 and 322 to place voltage controlled devices 320 and 322 in an active state or an inactive state.

In the active state, voltage controlled device 318 subjects the signal to an active state impedance, which contributes to the filtering process. In the example of FIG. 3, the signal may also pass through filter element 324 after passing through voltage controlled device 318. The resultant signal that emerges from filter element 324 is a signal within a predetermined frequency range that is associated with voltage controlled device 318 and filter element 324, which form the first filter.

In the inactive state, the impedance of voltage controlled device 318 is higher than the impedance of voltage controlled device 318 in the active state. For example, the impedance of voltage controlled device 318 is sufficiently high in the inactive state that voltage controlled device 318 may appear as an open circuit, preventing the signal from passing through filter element 324.

In various embodiments, voltage controlled device 318 is a voltage variable capacitor ("VVC") and may have (1) an active state in which its capacitance is initially adjusted to meet the needs of a specific filter design application, and (2) an inactive state in which the VVC is purposely driven to its extreme lowest capacitance. At its lowest capacitance, the impedance is highest for the VVC. Depending on the application, the capacitance of the VVC in an active state may be 0.36 pF, and the capacitance of the VVC in an inactive state may be 0.06 pF. This active/inactive capacitance ratio (e.g., 6:1) may be used in a wide range of applications. However, other capacitance values may be used for the active and inactive states, and other active/inactive capacitance ratios may be used.

In some circumstances, voltage controlled device 318 may be a voltage variable inductor ("VVI") instead of a VVC. It is also possible that voltage controlled elements 318, 320, and 322 may be a combination of VVCs and VVIs. For the exemplary embodiments discussed herein, the on/off ratio is maximized. As a result the voltage variable device need not be precisely controlled, or tuned, in its inactive state. In some circumstances, however, lower on/off ratios may be used requiring at least some adjustment of the voltage variable device in the inactive state. An example of a suitable on/off ratio is at least 3:1. For the examples, the on/off ratio is at least 6:1.

In various embodiments, filter elements 326 and 328 have their own unique predetermined frequency ranges that are different from that of filter element 324 and different from each other. By varying which combination of filter elements 324, 326, and 328 are used to filter the signal, different frequency responses may be obtained and output from controllable filter arrangement 300 via output 304. For example, a first frequency response could be obtained from controllable filter arrangement 300 when voltage controlled device 318 is in an active state and voltage controlled devices 320 and 322 are both in an inactive state. Other frequency responses could be obtained by only placing voltage controlled device 320 or voltage controlled device 322 in an active state. Although these examples describe only one voltage controlled device in an active state, other frequency responses could be obtained by placing two or more voltage controlled devices in an active state. Accordingly, a combined frequency response can be created by placing the voltage controller devices of two filters in the active states.

Figure 4:
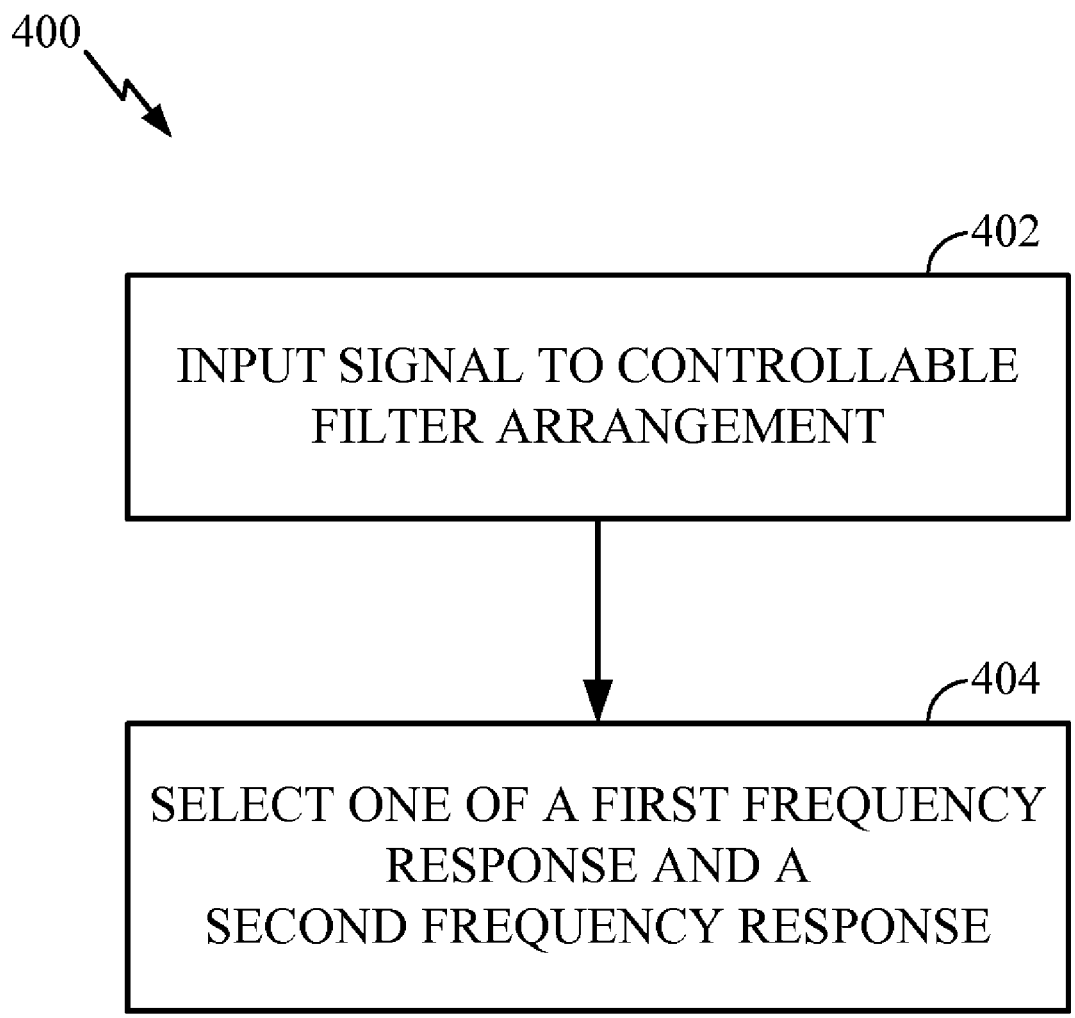
FIG. 4 is a method of filtering a signal with a filter with voltage controlled devices.

Referring now to FIG. 4, a method of filtering a signal with a controllable filter arrangement with voltage controlled devices is shown. Method 400 begins with inputting a signal to a controllable filter arrangement that includes voltage controlled devices (e.g., step 402). For example, the controllable filter arrangement may be similar to controllable filter arrangement 300 shown in FIG. 3.

At step 404, one of a first frequency response and a second frequency response is selected. For example, if method 400 is implemented with controllable filter arrangement 300 of FIG. 3, the first frequency response may be selected when voltage controlled device 318 is in an active state (e.g., and has an active state impedance) and voltage controlled devices 320 and 322 are in an inactive state (e.g., and have an inactive state impedance). In this example, the resultant signal (e.g., first frequency response) corresponds with the frequencies allowed to pass through voltage controlled device 318 and filter element 324.

Alternatively, a second frequency response may be selected when voltage controlled device 320 is in an active state (e.g., and has an active state impedance) and voltage controlled devices 318 and 322 are in an inactive state (e.g., and have an inactive state impedance). In this example, the resultant signal (e.g., second frequency response) corresponds with the frequencies allowed to pass through voltage controlled device 320 and filter element 326.

Once the desired frequency response is selected, it may be output from the controllable filter arrangement. Thus, according to method 400, the signal is either filtered by the first voltage controlled device and the first filter element (e.g., when the first voltage controlled device is active), or the signal is prevented from passing through the first filter element (e.g., when the first voltage controlled element is inactive).

Similarly, the signal is either filtered by the second voltage controlled device and the second filter element (e.g., when the second voltage controlled device is active), or the signal is prevented from passing through the second filter element (e.g., when the second voltage controlled device is inactive).

Although not shown in FIG. 4, method 400 may additionally include a step in which a control signal (e.g., voltage control signal) is sent to one or more voltage controlled devices to switch the voltage controlled devices between the active state and the inactive state or vice versa.

Method 400 has been described in terms of only two frequency responses in order to simplify the description. However, as described above, a greater number of potential frequency responses can be selected when a greater number of voltage controlled devices and filter elements are used (e.g., by mixing the number and configuration of voltage controlled devices that are placed in an active state). Although the steps of FIG. 4 have been discussed and depicted within a particular order, one of skill in the art should understand that the steps can be performed in a different order or otherwise interchanged without departing from the scope of the various embodiments.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Further, the controller or processor may be integrated directly with the filter block, it may be stand-alone, or it may be integrated as part of another integrated circuit device.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A controllable filter arrangement having a controllable frequency response between an input and an output, the controllable filter arrangement comprising:
    a first filter connected between the input and the output and comprising a first voltage controlled device having an impedance responsive to a first device control signal to form a filter element of the first filter at a first device active impedance; and
    a second filter connected between the input and the output and comprising a second voltage controlled device having an impedance responsive to a second device control signal to form a filter element of the second filter at a second device active impedance, wherein at least one of the first voltage controlled device and the second voltage controlled device is a voltage variable inductor (VVI);
    the controllable filter arrangement having a first frequency response in accordance with the first filter when the first voltage device has the first device active impedance and the second voltage controlled device has second device inactive impedance higher than the second device active impedance; and
    the controllable filter arrangement having a second frequency response in accordance with the second filter when the second voltage device has the second device active impedance and the first voltage controlled device has first device inactive impedance higher than the first device active impedance.

2. The controllable filter arrangement of claim 1, in which the first filter further comprises:
    at least one of a band pass filter, a stop-band filter, a high pass filter, and a low pass filter.

3. The controllable filter arrangement of claim 1, wherein at least one of the first voltage controlled device and the second voltage controlled device is a voltage variable capacitor (VVC).

4. The controllable filter arrangement of claim 3, in which a ratio between a first capacitance of the VVC in the active state and a second capacitance of the VVC in the inactive state is 6:1.

5. The controllable filter arrangement of claim 1, further comprising:
    a controller coupled to the first voltage controlled device to signal the first voltage controlled device to change between the active state and the inactive state.

6. A controllable filter arrangement having a controllable frequency response between an input and an output, the controllable filter arrangement comprising:
    a first filter connected between the input and the output and comprising a first voltage variable capacitor ("VVC") having a capacitance responsive to a first VVC control signal to form a filter element of the first filter in a first VVC active state;
    a second filter connected between the input and the output and comprising a second VVC having a capacitance responsive to a second VVC control signal to form a filter element of the second filter in a second VVC active state; and
    a third filter connected between the input and the output and comprising a voltage variable inductor ("VVI");
    the controllable filter arrangement having a first frequency response in accordance with the first filter when the first VVC has a first VVC active capacitance and the second VVC has a second VVC inactive capacitance lower than a second VVC active capacitance; and
    the controllable filter arrangement having a second frequency response in accordance with the second filter when the second VVC has a second VVC active capacitance and the first VVC has a first VVC inactive capacitance lower than a first VVC active capacitance.

7. The controllable filter arrangement of claim 6, in which the first filter further comprises:
    at least one of a band pass filter, a stop-band filter, a high pass filter, and a low pass filter.

8. The controllable filter arrangement of claim 6, in which a ratio between the first VVC active capacitance and the first VVC inactive capacitance is at least 3:1.

9. The controllable filter arrangement of claim 8, in which a ratio between the first VVC active capacitance and the first VVC inactive capacitance is at least 6:1.

10. The controllable filter arrangement of claim 6, further comprising:
    a controller coupled to the first VVC and to the second VVC, the controller to signal the first VVC to change between the active state and the inactive state and to signal the second VVC to change between the active state and the inactive state.

11. A method, comprising:
    inputting a signal to a controllable filter arrangement having
        a first filter connected between an input and an output and comprising a first voltage controlled device having an impedance responsive to a first device control signal to form a filter element of the first filter at a first device active impedance; and a second filter connected between the input and the output and comprising a second voltage controlled device having an impedance responsive to a second device control signal to form a filter element of the second filter at a second device active impedance, wherein at least one of the first voltage controlled device and the second voltage controlled device is a voltage variable inductor (VVI); and selecting one of a first frequency response and a second frequency response, the first frequency response in accordance with the first filter when the first voltage device has the first device active impedance and the second voltage controlled device has second device inactive impedance higher than the second device active impedance; and the second frequency response in accordance with the second filter when the second voltage device has the second device active impedance and the first voltage controlled device has first device inactive impedance higher than the first device active impedance.

12. The method of claim 11, further comprising:
if the first voltage controlled device is in an active state, outputting a signal from the controllable filter arrangement in accordance with the first frequency response.

13. The method of claim 11, further comprising selecting one of the first frequency response, the second frequency response, and a third frequency response, the third frequency response in accordance with a combination of the first filter and the second filter when the first voltage device has the first device active impedance and the second voltage controlled device has second device active impedance.

14. The method of claim 11, further comprising:
sending a signal to the first voltage controlled device to change between the active state and an inactive state.

15. A method of filtering a signal, comprising:
inputting a signal to a controllable filter arrangement having
 a first filter connected between an input and an output and comprising a first voltage variable capacitor ("VVC") having a capacitance responsive to a first VVC control signal to form a filter element of the first filter in a first VVC active state;
 a second filter connected between the input and the output and comprising a second VVC having a capacitance responsive to a second VVC control signal to form a filter element of the second filter in a second VVC active state; and
 a third filter connected between the input and the output and comprising a voltage variable inductor ("VVI"); and selecting one of a first frequency response and a second frequency response, the first frequency response in accordance with the first filter when the first VVC has a first VVC active capacitance and the second VVC has a second VVC inactive capacitance lower than a second VVC active capacitance; and the second frequency response in accordance with the second filter when the second VVC has a second VVC active capacitance and the first VVC has a first VVC inactive capacitance lower than a first VVC active capacitance; and establishing either the first frequency response or the second frequency response through the controllable filter arrangement.

16. The method of claim 15, further comprising:
sending a signal to the first VVC to change between the first VVC active state and the first VVC inactive state.

17. A controllable filter arrangement means having a controllable frequency response between an input and an output, the controllable filter arrangement means comprising:

a first filter means connected between the input and the output and comprising a first variable impedance means having an impedance responsive to a first control signal to form a filter element means of the first filter means at a first variable impedance means active impedance; and a second filter means connected between the input and the output and comprising a second variable impedance means having an impedance responsive to a second control signal to form a filter element means of the second filter means at a second variable impedance means active impedance, wherein at least one of the first variable impedance means and the second variable impedance means is a voltage variable inductor (VVI); and the controllable filter arrangement means having a first frequency response in accordance with the first filter means when the first variable impedance means has the first variable impedance means active impedance and the second variable impedance means has a second variable impedance means inactive impedance higher than the second variable impedance means active impedance; and the controllable filter arrangement means having a second frequency response in accordance with the second filter means when the second variable impedance means has the second variable impedance means active impedance and the first variable impedance means has first variable impedance means inactive impedance higher than the first variable impedance means active impedance.

18. A computer readable medium containing instructions that, when executed, perform the following steps:
inputting a signal to a controllable filter arrangement having
 a first filter connected between an input and an output and comprising a first voltage controlled device having an impedance responsive to a first device control signal to form a filter element of the first filter at a first device active impedance; and
 a second filter connected between the input and the output and comprising a second voltage controlled device having an impedance responsive to a second device control signal to form a filter element of the second filter at a second device active impedance, wherein at least one of the first voltage controlled device and the second voltage controlled device is a voltage variable inductor (VVI); and selecting one of a first frequency response and a second frequency response, the first frequency response in accordance with the first filter when the first voltage device has the first device active impedance and the second voltage controlled device has second device inactive impedance higher than the second device active impedance; and the second frequency response in accordance with the second filter when the second voltage device has the second device active impedance and the first voltage controlled device has first device inactive impedance higher than the first device active impedance.

19. The computer readable medium of claim 18, further containing instructions that, when executed, perform the following:
   sending a signal to the first voltage controlled device to change between an active state and an inactive state.

20. A method, comprising:
   inputting a signal to a controllable filter arrangement having
      a first filter connected between an input and an output and comprising a first voltage controlled device having an impedance responsive to a first device control signal to form a filter element of the first filter at a first device active impedance; and
      a second filter connected between the input and the output and comprising a second voltage controlled device having an impedance responsive to a second device control signal to form a filter element of the second filter at a second device active impedance; and
   selecting one of a first frequency response, a second frequency response, and a third frequency response,
      the first frequency response in accordance with the first filter when the first voltage device has the first device active impedance and the second voltage controlled device has second device inactive impedance higher than the second device active impedance;
      the second frequency response in accordance with the second filter when the second voltage device has the second device active impedance and the first voltage controlled device has first device inactive impedance higher than the first device active impedance; and
      the third frequency response in accordance with a combination of the first filter and the second filter when the first voltage device has the first device active impedance and the second voltage controlled device has second device active impedance.

* * * * *